United States Patent
Sheu et al.

(10) Patent No.: US 7,773,410 B2
(45) Date of Patent: Aug. 10, 2010

(54) WRITING SYSTEM AND METHOD FOR PHASE CHANGE MEMORY

(75) Inventors: Shyh-Shyuan Sheu, Taichung (TW); Lieh-Chiu Lin, Kaohsiung (TW); Pei-Chia Chiang, Taipei (TW); Wen-Pin Lin, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 191 days.

(21) Appl. No.: 12/165,761

(22) Filed: Jul. 1, 2008

(65) Prior Publication Data
US 2009/0122599 A1 May 14, 2009

(30) Foreign Application Priority Data
Nov. 8, 2007 (TW) .............................. 96142224 A

(51) Int. Cl.
*G11C 11/00* (2006.01)
(52) U.S. Cl. ....................................... 365/163; 365/148
(58) Field of Classification Search ................ 365/163, 365/148, 100
See application file for complete search history.

(56) References Cited

U.S. PATENT DOCUMENTS

| | | | |
|---|---|---|---|
| 7,110,286 B2 * | 9/2006 | Choi et al. | 365/163 |
| 7,457,151 B2 * | 11/2008 | Cho et al. | 365/163 |
| 7,542,356 B2 * | 6/2009 | Lee et al. | 365/189.07 |
| 7,609,544 B2 * | 10/2009 | Osada et al. | 365/163 |
| 2005/0068804 A1 | 3/2005 | Choi et al. | |

* cited by examiner

*Primary Examiner*—Anh Phung
(74) *Attorney, Agent, or Firm*—Thomas, Kayden, Hostemeyer & Risley

(57) ABSTRACT

An embodiment of a writing system for a phase change memory based on a present application is disclosed. The writing system comprises a first phase change memory (PCM) cell, a second PCM cell, a first writing circuit and a verifying circuit. The first writing circuit executes a writing procedure, receives and writes a first data to the first PCM cell. The verifying circuit executes a verifying procedure and the circuit further comprises a processing unit and a second writing circuit. The processing unit reads and compares the data stored in the second PCM cell with a second data. The second writing circuit writes the second data to the second PCM cell when the data stored in the second PCM cell and the second data are not matched.

16 Claims, 7 Drawing Sheets

WRITING SYSTEM AND METHOD FOR PHASE CHANGE MEMORY

CROSS REFERENCE TO RELATED APPLICATIONS

This application claims priority of Taiwan Patent Application No. 96142224, filed on Nov. 8, 2007 the entirety of which is incorporated by reference herein.

BACKGROUND OF THE INVENTION

1. Field of the Invention

The invention relates to a writing system and method for a phase change memory.

2. Description of the Related Art

With the growth in the use of portable electronic devices, demand for non-volatile memory has increased. Among the various kinds of non-volatile memory, phase change memory is the most competitive next generation non-volatile memory due to its higher speed, lower power consumption, higher capacity, reliability, easier process integration and lower cost.

The operation of a phase change memory is mainly achieved by inputting two current pulses with different current magnitudes to the phase change memory to switch the phase change memory between an amorphous state and crystalline state. According to Ohm-Joule's Law, when the current is input to the phase change memory, the phase change memory is heated. The phase change memory may thus be crystallized or melted based on different currents. Based on the described illustration, the logic state of the phase change memory can be switched by inputting different currents, enabling data storage. FIG. 1 is a schematic diagram showing the writing current pulse and the reading current pulse of the phase change memory. When a RESET operation is applied to the phase change memory, a reset current $I_{RESET}$ with high amplitude and short pulse width is applied, the phase change memory is thus melted because the temperature of the phase change memory exceeds the melting temperature of the phase change material of the phase change memory, $T_m$. When the temperature of the phase change memory decreases, the state of the phase change memory is transformed to the amorphous state due to the insufficient cool down period. Thus, the phase change memory has high resistance. When a SET operation is applied to the phase change memory, a set current $I_{SET}$ with lower amplitude and longer pulse width is applied. The phase change memory is heated by the set current $I_{SET}$, and the temperature of the phase change memory is held substantially between the melting temperature $T_m$ and a crystallizing temperature $T_c$ of the phase change material used by the phase change memory. During the SET operation, the melted phase change memory has sufficient time for crystallizing and the phase change memory thus has a low resistance.

As described, the phase change memory respectively stores data with logic state 1 and 0 by the RESET operation and the SET operation. When reading the phase change memory, a read current $I_{READ}$ the amplitude of which is less than the set current $I_{SET}$, is applied to the phase change memory to determine the logic state of the data stored in the phase change memory based on the sensed resistance.

BRIEF SUMMARY OF THE INVENTION

An embodiment of the writing system for a phase change memory based on the present application is disclosed. The writing system comprises a first phase change memory (PCM) cell, a second PCM cell, a first writing circuit and a verifying circuit. The first writing circuit executes a writing procedure, receives and writes a first data to the first PCM cell. The verifying circuit executes a verifying procedure and the circuit further comprises a processing unit and a second writing circuit. The processing unit reads and compares the data stored in the second PCM cell with a second data. The second writing circuit writes the second data to the second PCM cell when the data stored in the second PCM cell and the second data are not matched.

An embodiment of the invention provides a writing method for a phase change memory and the method is implemented by a first writing circuit and a verifying circuit. The method comprises performing a writing procedure to a first phase change memory (PCM) cell in a first cycle; performing a verifying procedure to a second PCM cell in the first cycle; and if the verifying result of the second PCM cell is matched, the verifying circuit outputs a current adjustment signal to the first writing circuit to adjust a first writing current output by the first writing circuit.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
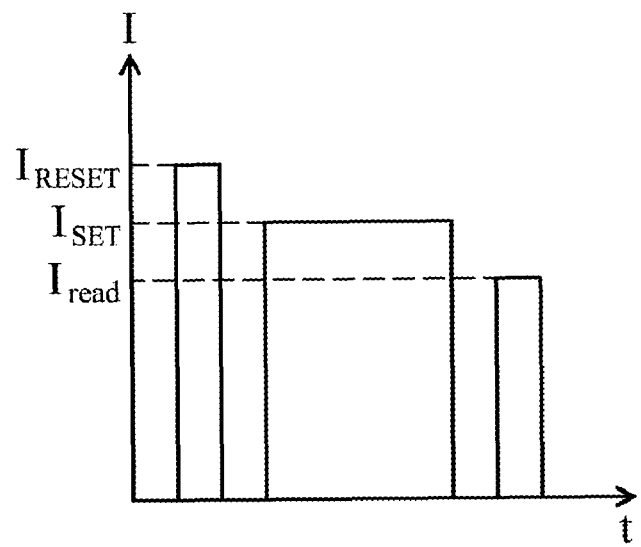
FIG. 1 is a schematic diagram showing the writing current pulse and the reading current pulse of the phase change memory.
Figure 2:
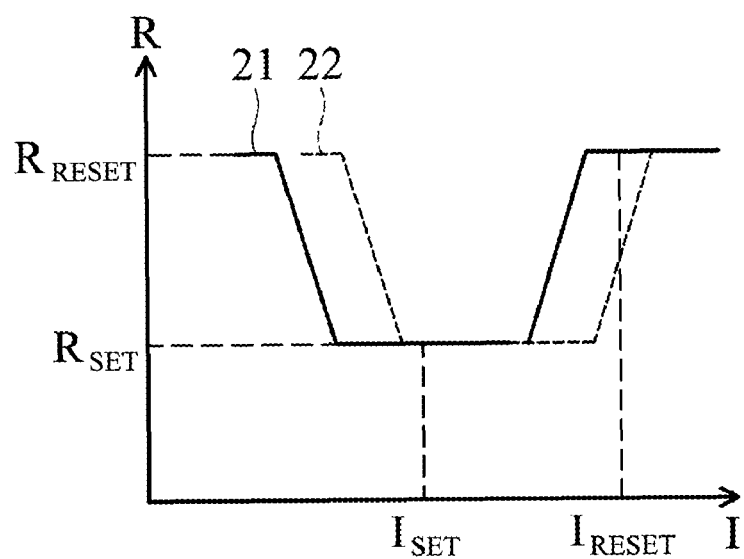
FIG. 2 is a current-resistance characteristic curve diagram of a phase change memory.

FIG. 2 is a current-resistance characteristic curve diagram of a phase change memory. Curve 21 is a current-resistance characteristic curve of a normal phase change memory. When the phase change memory receives the set current $I_{SET}$, the resistance of the phase change memory is substantially $R_{SET}$, and when the phase change memory receives the reset current $I_{RESET}$, the resistance of the phase change memory is substantially $R_{RESET}$. If the access number of the phase change memory increases, the current-resistance characteristic curve may drift, such as the curve 22. Take the curve 22 for example, when the phase change memory receives the set current $I_{SET}$, the resistance of the phase change memory is still substantially $R_{SET}$, but when the phase change memory receives the reset current $I_{RESET}$, the resistance of the phase change memory is not $R_{RESET}$. Thus, the phase change memory can be normally accessed. In this situation, higher set current $I_{SET}$ and reset current $I_{RESET}$ are required to keep the phase change memory operating normally.

In another embodiment, the set current $I_{SET}$ cannot maintain the resistance of the phase change memory $R_{SET}$ due to the process of the phase change memory. In this situation, a smaller set current $I_{SET}$ and reset current $I_{RESET}$ are required to keep the phase change memory operating normally.

Figure 3:
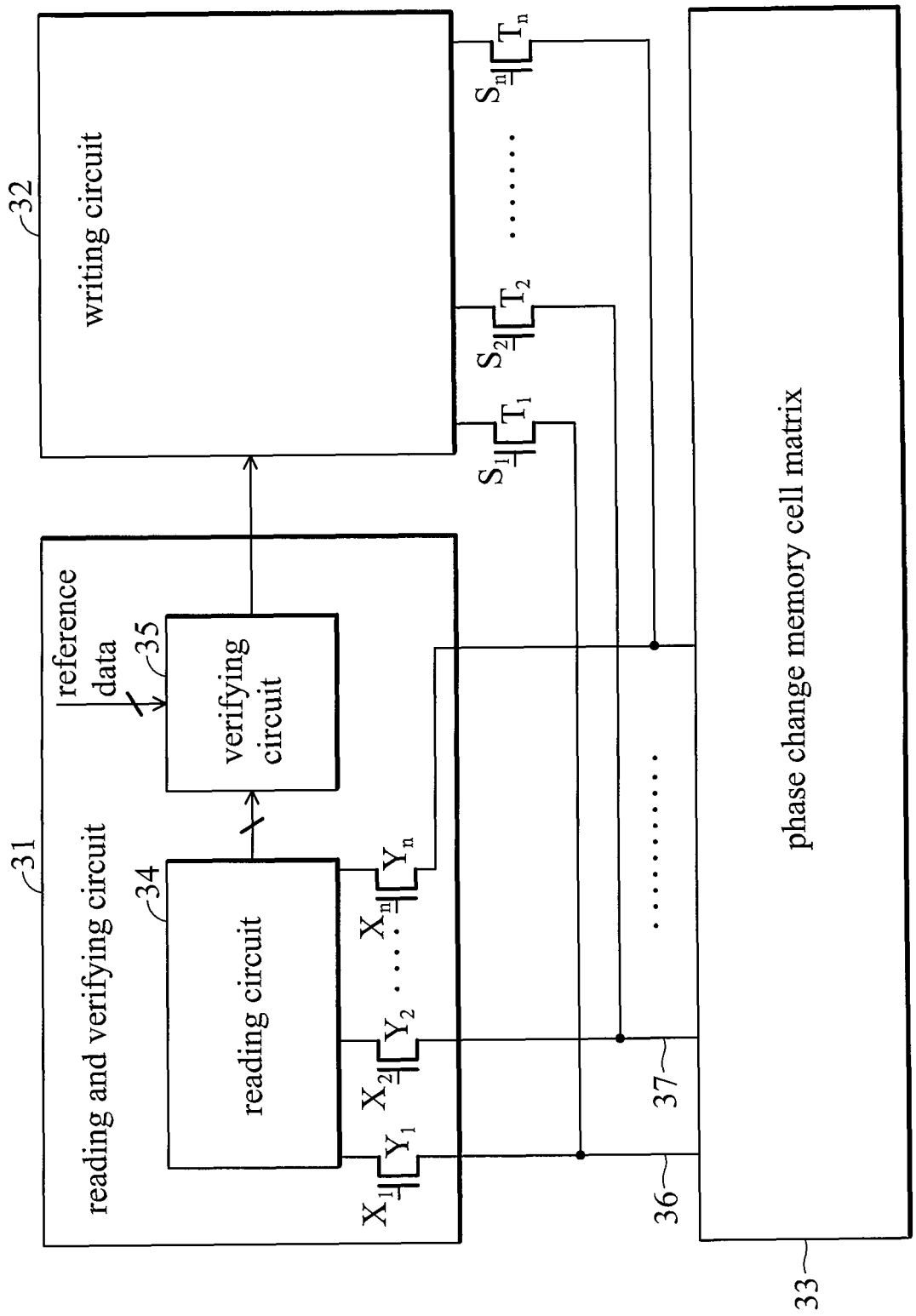
FIG. 3 is a schematic diagram of the control circuit for the phase change memory according to an embodiment of the invention.

FIG. 3 is a schematic diagram of the control circuit for the phase change memory according to an embodiment of the invention. According to the architecture of the control circuit in FIG. 3, a read/write splitting structure is applied to increase the performance of the phase change memory. The reading and verifying circuit 31 comprises a reading circuit 34 and a verifying circuit 35 to verify the phase change memory cell matrix 33. When the writing circuit 32 writes to the bit line 37 of the phase change memory cell matrix 33, the reading and verifying circuit 31 verifies the PCM cell coupled to the bit line 36. The reading circuit 34 reads and transmits the data stored in the PCM cell coupled to the bit line 36 to the verifying circuit 35. The verifying circuit 35 compares the data from the reading circuit 34 with a reference data. When the data read by the reading circuit 34 is the same as the reference data, the PCM cell matrix 33 can be normally accessed. If the data read by the reading circuit 34 is not the same as the reference data, a control signal is output to the writing circuit 32 to adjust the magnitude of the output current thereof.

Typically, to increase the write speed of the phase change memory, the writing current is more than usual; thus, the W/L ratio of the transistor is also larger than usual to carry the larger writing current. For example, when the writing circuit 32 writes to the PCM cells coupled to the bit line 37, the control signal S1 turns the transistor T1 on and the writing current can be transmitted to the PCM cell matrix 33 via the transistor T1. Similarly, the operation of the transistors T2 and Tn is the same as the operation of the transistor T1. When the reading circuit 34 reads the PCM cells coupled to the bit line 34, the control signal X1 turns the transistor Y1 on and the reading current can be transmitted to the PCM cell matrix 33 via the transistor Y1. Similarly, the operation of the transistors Y2 and Yn is the same as the operation of the transistor Y1.

Typically, when reading the phase change memory, a reading current with smaller magnitude is usually applied, however, the small current cannot easily drive the transistor with larger W/L ratio. Therefore, although the write speed increases, the read speed decreases. The performance of the phase change memory still cannot improve significantly. In the present innovative embodiment, the switches coupled to the writing circuit 32 and the reading circuit 34 are implemented by different transistors with different W/L ratios. To increase the write speed, the switch coupled to the writing circuit 32 is implemented by a transistor with larger W/L ratio, such as the transistor T1, to carry a larger current. To increase the read speed, the switch coupled to the reading circuit 34 is implemented by a transistor with smaller W/L ratio, such as the transistor X1, to carry a smaller current.

Figure 4:
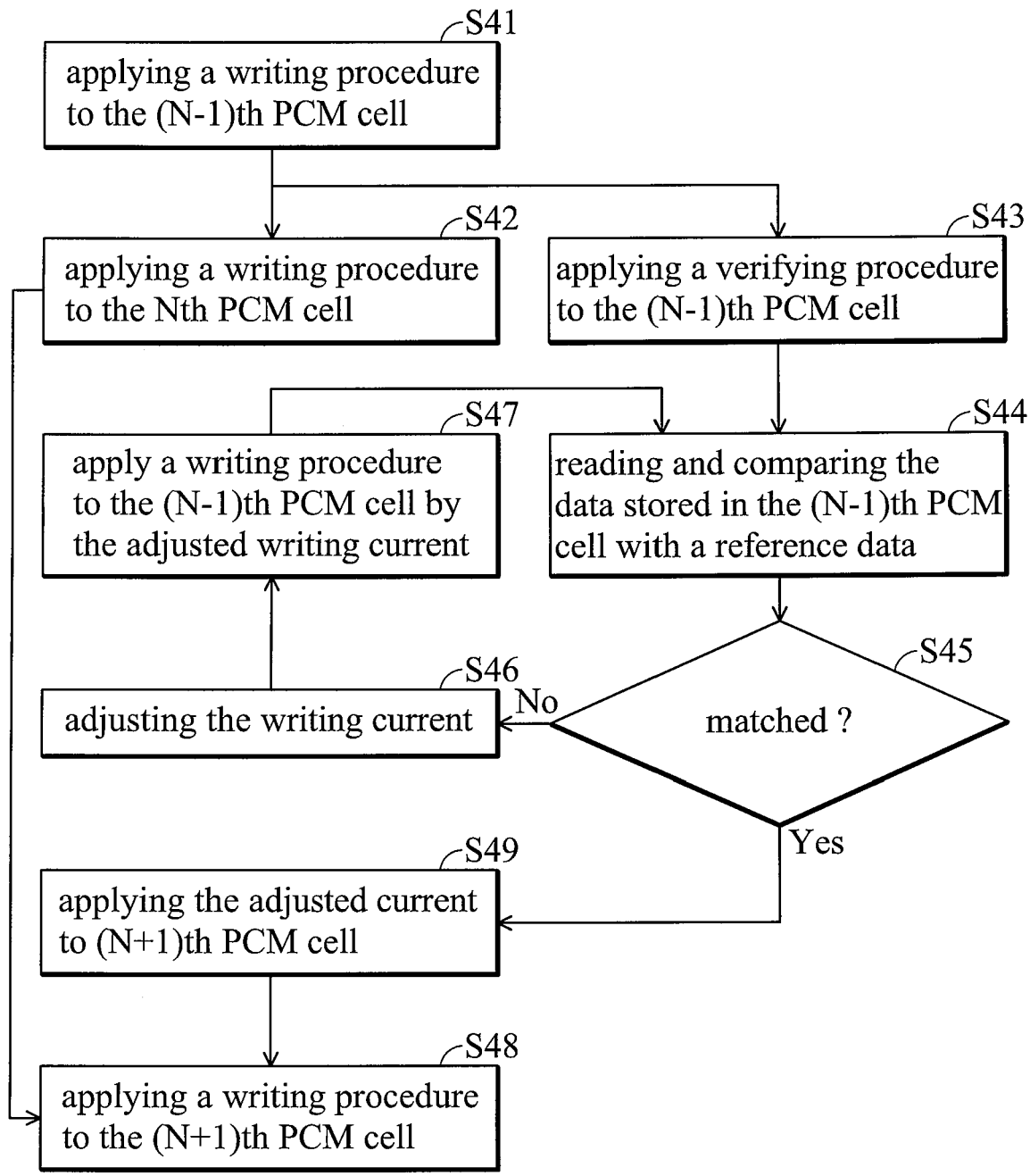
FIG. 4 is a flowchart of the writing procedure and the verifying procedure according to an embodiment of the invention.

FIG. 4 is a flowchart of the writing procedure and the verifying procedure according to an embodiment of the invention. In step S41, a writing procedure is first applied to the (N−1)th PCM cell, and the procedure jumps to both the step S42 and step S43. In step S42, another writing procedure is applied to the Nth PCM cell. At the same time, in step S43, a verifying procedure is applied to the (N−1)th PCM cell. In step S44, a read current is applied to read the data stored in the (N−1)th PCM cell, and a reference data is then compared with the data stored in the (N−1)th PCM cell. The reference data is the data which was originally written to the (N−1)th PCM cell. In step S45, a comparison circuit compares the data stored in the (N−1)th PCM cell with the reference data. If the data stored in the (N−1)th PCM cell is the same as the reference data, the procedure jumps to step S47. If the data stored in the (N−1)th PCM cell is the same as the reference data, the procedure jumps to step S46. In step S46, the writing current is adjusted based on the comparison result generated in step S45 and when the comparison result in the step S45 is yes, the adjusted writing current is applied to write the (N+1)th PCM cell in step S49 for executing a writing procedure to the (N+1)th PCM cell in step S48. In this embodiment, the steps S42 to S46 are implemented during the same cycle. When the step S48 is executed, a verifying procedure is also applied to the Nth PCM cell.

In this embodiment, after the writing current is adjusted in step S46, the procedure jumps to step S47 to apply a writing procedure to the (N−1)th PCM cell. In this embodiment, the writing current is adjusted based on the comparison result generated in step S45. In another embodiment the writing procedure in the step S47 and step S48 are implemented by different writing circuit. When the writing procedure is applied to the (N−1)th PCM cell, a verifying procedure is also applied to the Nth PCM cell.

Figure 5:
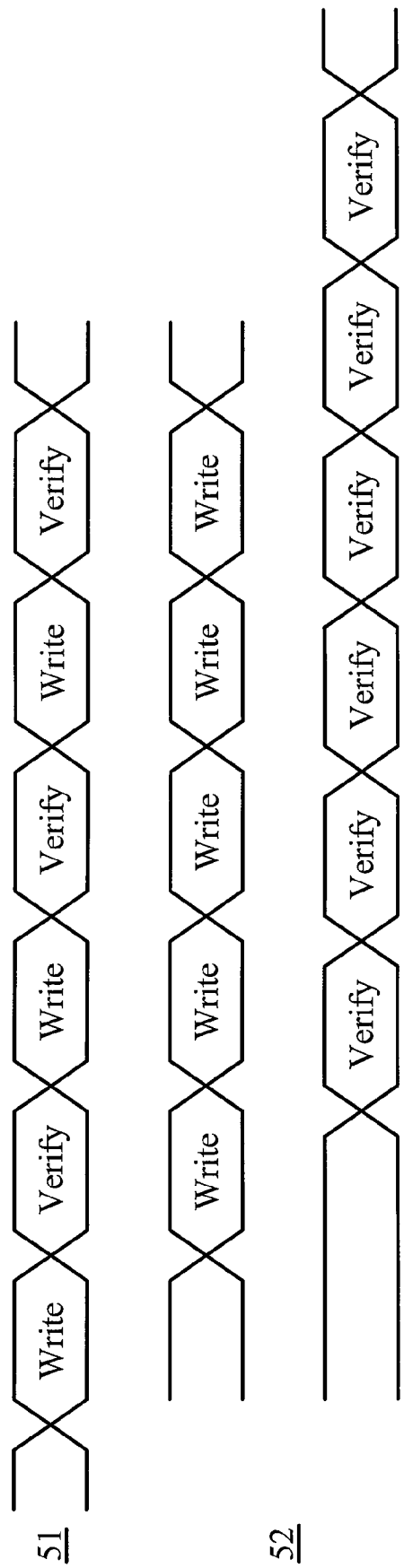
FIG. 5 is a timing diagram of a conventional writing procedure and verifying procedure for the phase change memory and the present innovative writing procedure and verifying procedure for the phase change memory.

FIG. 5 is a timing diagram of a conventional writing procedure and verifying procedure for the phase change memory and the present innovative writing procedure and verifying procedure for the phase change memory. Timing diagram 51 shows the timing diagram of a conventional writing procedure and verifying procedure for the phase change memory. The conventional verifying procedure is executed after the writing procedure. If the verifying procedure passes, another writing procedure for the next PCM cell is executed. If the verifying procedure fails, the writing procedure is re-executed for the PCM cell. Timing diagram is timing diagram of the present innovative writing procedure and verifying procedure for the phase change memory. In this embodiment, the writing procedure and the verifying procedure can be implemented by different processing unit. Therefore, the processing time can be significantly reduced. In this embodiment, the processing unit can be implemented by software or hardware.

Figure 6:
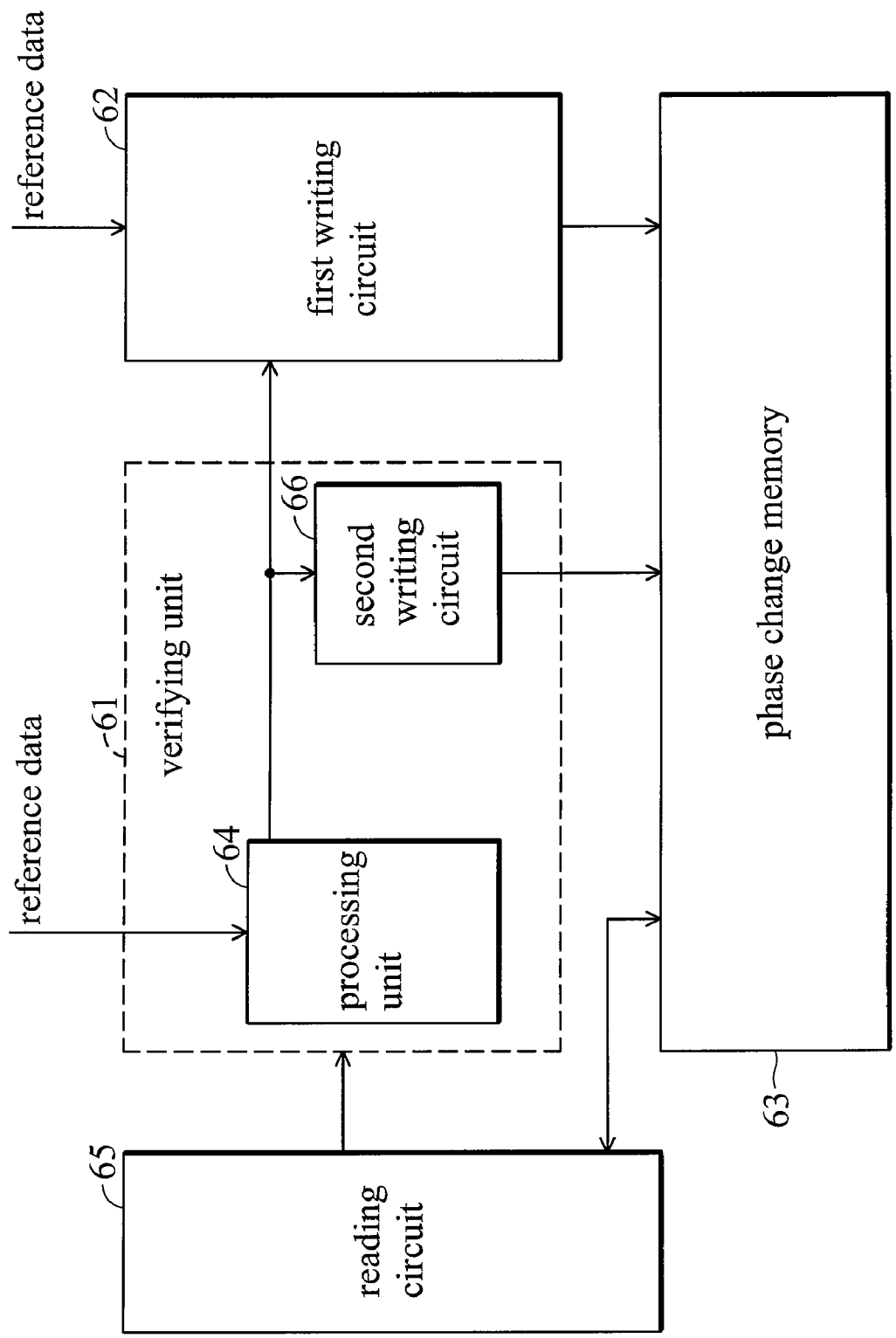
FIG. 6 is a schematic diagram of an embodiment of the writing system for the phase change memory according to the invention.

FIG. 6 is a schematic diagram of an embodiment of the writing system for the phase change memory according to the invention. The first writing circuit 62 receives and writes a reference data to the phase change memory 63. The verifying unit 61 comprises a processing unit 64 and a second writing circuit 66. The reading circuit 65 outputs a read current to the phase change memory 63 to read the data stored in the phase change memory 63. The processing unit 64 compares the reference data and the data read from the phase change memory 63 read by the reading circuit 65. If the reference data is the same as the data read from the phase change memory 63, a verify signal is transmitted to the first writing circuit 62 to maintain the magnitude of the writing current of the first writing circuit 62. If the reference data is not the same as the data read from the phase change memory 63, a control signal is transmitted to the first writing circuit 62 and the second writing circuit 66 to adjust the magnitude of the writing current.

The second writing circuit 66 receives the control signal and re-writes the reference data to the phase change memory 63 by the adjusted current. In this embodiment, when the verifying unit 61 verifies the (N−1)th PCM cell, the first writing circuit 62 writes to the Nth PCM cell. In one embodiment, if the writing procedure executed by the first writing circuit 62 is not finished and the first writing circuit 62 receives the control signal, the first writing circuit 62 interrupts the writing procedure and re-writes the reference data to the PCM cell by the adjusted writing current. In another embodiment, when the verifying unit 61 verifies that the data written to the (N−1)th PCM cell is wrong and the writing procedure executed by the first writing circuit 62 is finished, the first writing circuit 62 adjusts the magnitude of the writing current and executes a writing procedure to the (N+1)th PCM cell by the adjusted writing current. In another embodiment, the first writing circuit 62 and the second writing circuit 64 further respectively comprise an auxiliary writing circuit to adjust the magnitude of the writing current from the first writing circuit 62 and the second writing circuit 64 based on the control signal.

Figure 7:
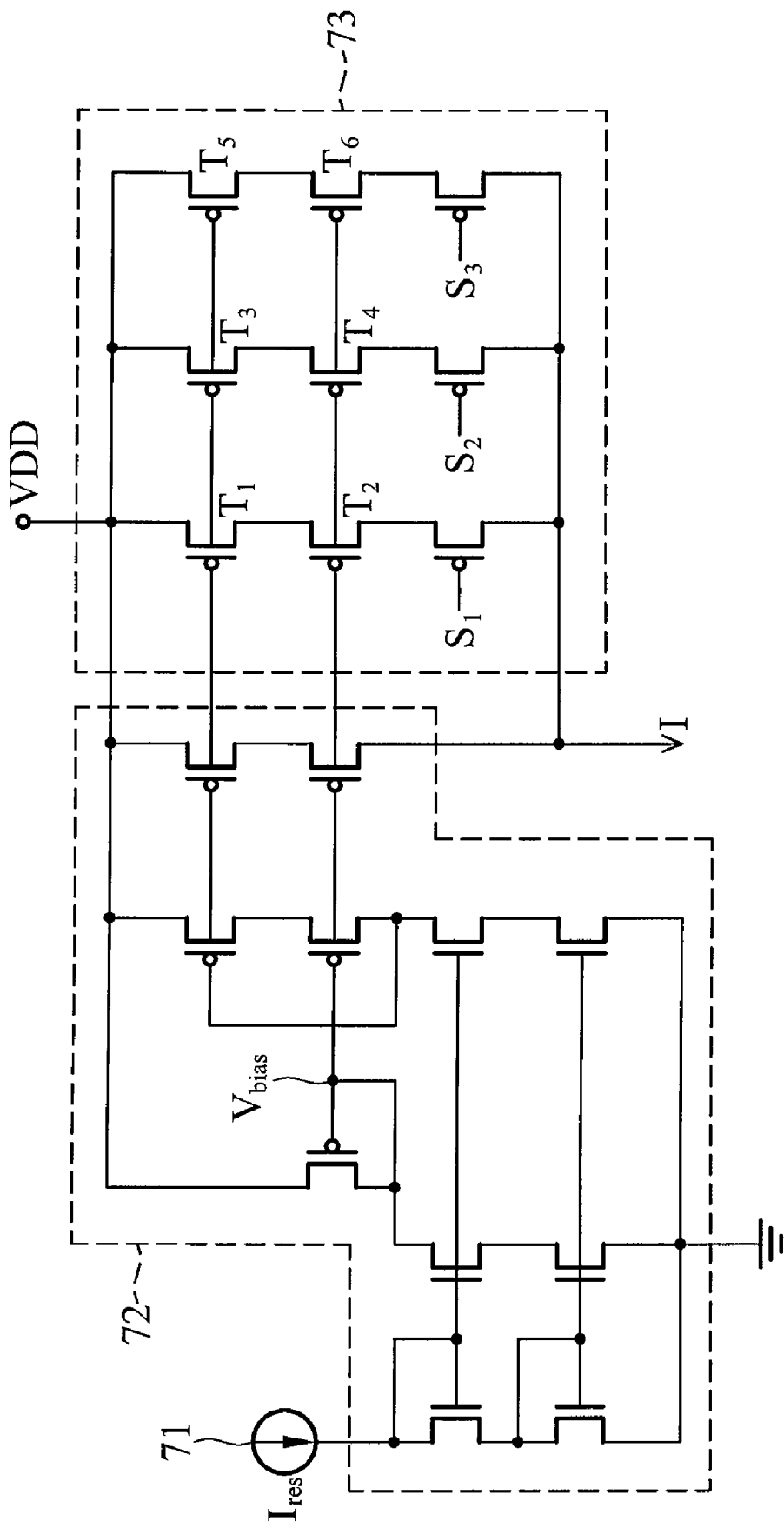
FIG. 7 is a circuit diagram of a writing circuit and the auxiliary writing circuit according to an embodiment of the invention.

FIG. 7 is a circuit diagram of a writing circuit and the auxiliary writing circuit according to an embodiment of the invention. The writing circuit 72 outputs the writing current I based on the reference current $I_{res}$ output by a reference current source 71. The auxiliary driving 73 utilizes the current mirror and the different W/L ratios of transistors T1, T2, T3, T4, T5 and T6 to output different auxiliary currents with different magnitudes. The auxiliary driving circuit 73 outputs the auxiliary current based on the control signal S1, S2 and S3. In this embodiment, the auxiliary currents output by the auxiliary driving circuit 73 can be output after addition. Those skilled in the art can modify the auxiliary driving circuit 73 to let the auxiliary currents output by the auxiliary driving circuit 73 to be output after subtraction.

Figure 8:
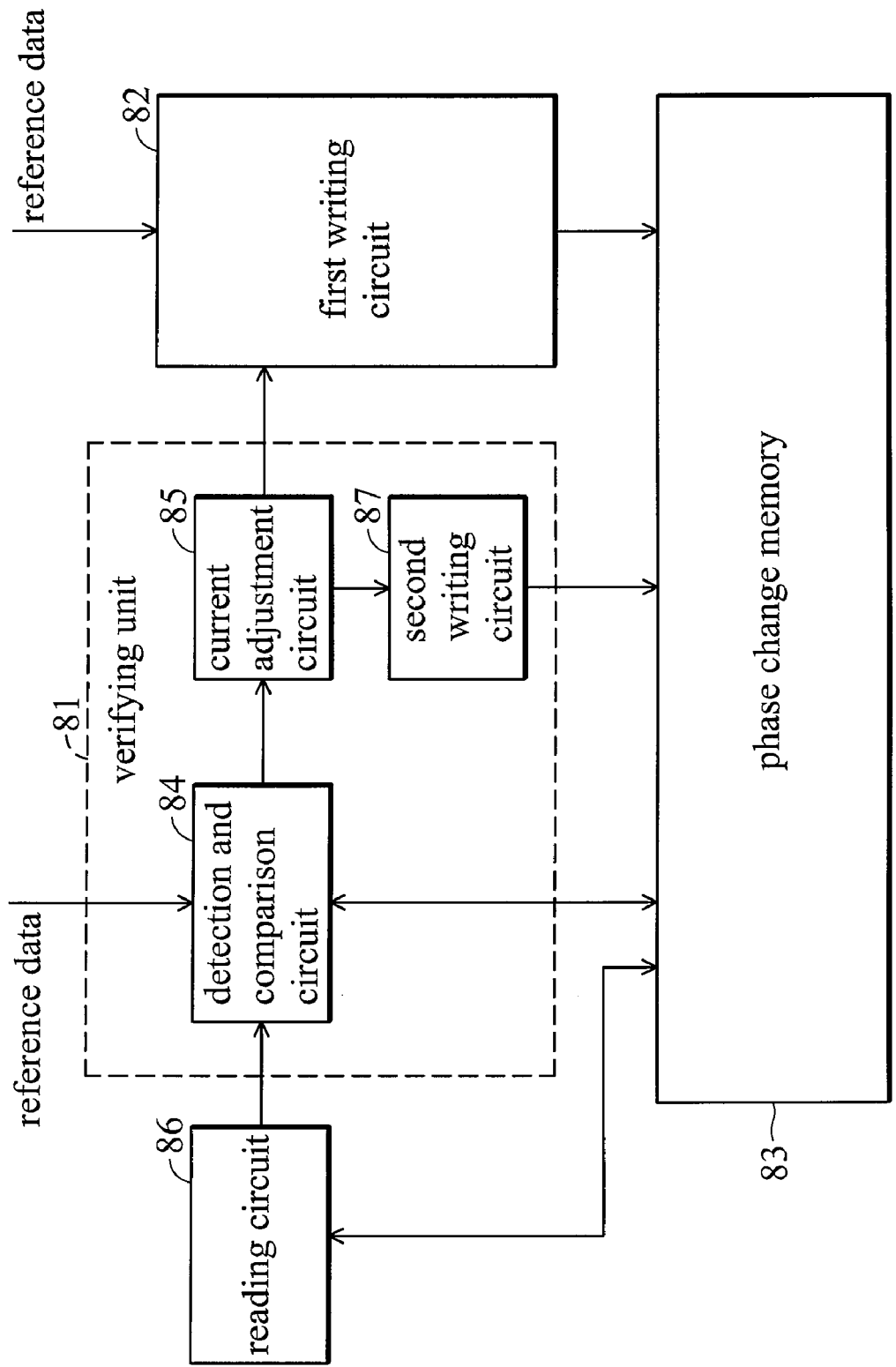
FIG. 8 is a schematic diagram of a writing system for the phase change memory according to another embodiment of the invention.

FIG. 8 is a schematic diagram of a writing system for the phase change memory according to another embodiment of the invention. The first writing circuit 82 receives and writes the data to the phase change memory 83. The verifying unit 81 verifies whether the data stored in the phase change memory 83 is correct based on a reference data. In this embodiment, when the verifying unit 81 verifies the (N−1)th PCM cell, the first writing circuit 82 writes the Nth PCM cell.

The verifying unit 81 comprises a detection and comparison circuit 84, a current adjustment circuit 85 and a second writing circuit 87. The reading circuit 86 reads the phase change memory 83 by a reading current and transmits the read data to the detection and comparison circuit 84. The detection and comparison circuit 84 compares the data from the reading 86 and a reference data. If the two data are matched, a verify signal is transmitted to the first writing 82 to maintain the magnitude of the writing current of the first writing circuit 82. If the reference data is not the same as the data read from the phase change memory 83, a control signal is transmitted to the first writing circuit 82 and the second writing circuit 87 to adjust the magnitude of the writing current. When the operation after writing Nth PCM cell is to read the (N+1)th PCM cell, the Nth PCM cell still can be verified.

The second writing circuit 87 receives the control signal and re-writes the reference data to the phase change memory 83 by the adjusted current. In this embodiment, when the verifying unit 81 verifies the (N−1)th PCM cell, the first writing circuit 82 writes to the Nth PCM cell. In one embodiment, if the writing procedure executed by the first writing circuit 82 is not finished and the first writing circuit 82 receives the control signal, the first writing circuit 82 interrupts the writing procedure and re-writes the reference data to the PCM cell by the adjusted writing current. In another embodiment, when the verifying unit 81 verifies that the data written to the (N−1)th PCM cell is wrong and the writing procedure executed by the first writing circuit 82 is finished, the first writing circuit 82 adjusts the magnitude of the writing current and executes a writing procedure to the (N+1)th PCM cell by the adjusted writing current. In another embodiment, the first writing circuit 82 and the second writing circuit 87 further respectively comprise an auxiliary writing circuit to adjust the magnitude of the writing current from the first writing circuit 82 and the second writing circuit 87 based on the control signal.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A writing system for a phase change memory, comprising:
    a first phase change memory (PCM) cell and a second PCM cell;
    a first writing circuit, executing a writing procedure, receiving and writing a first data to the first PCM cell; and
    a verifying circuit executing a verifying procedure, wherein the verifying circuit further comprises,
        a processing unit reading and comparing the data stored in the second PCM cell with a second data, and
        a second writing circuit to write the second data to the second PCM cell when the data stored in the second PCM cell and the second data are not matched.

2. The system as claimed in claim 1, the processing further comprising:
    a reading circuit to read the data stored in the second PCM cell; and
    a processor to compare the second data with the data stored in the second PCM cell and output a current adjustment signal to the first writing circuit and the second writing circuit based on the comparison result.

3. The system as claimed in claim 2, further comprising:
    a first transistor having a first control terminal, a first input terminal and a first output terminal, wherein the first output terminal is coupled to the first PCM cell and the first control terminal is controlled by a first control signal; and
    a second transistor having a second control terminal, a second input terminal and a second output terminal, wherein the second input terminal is coupled to the reading circuit, the second output terminal is coupled to the second PCM cell and the second control terminal is controlled by a second control signal.

4. The system as claimed in claim 3, wherein the W/L ratio of the second transistor is smaller than the W/L ration of the first transistor.

5. The system as claimed in claim 2, wherein the processor further comprises:
    a detection and comparison circuit to compare the data stored in the second PCM cell with a second data to output a comparison signal; and a current adjustment control circuit receiving the comparison signal to output the current adjustment signal.

6. The system as claimed in claim 2, wherein the first writing circuit further comprises a first auxiliary writing circuit receiving the current adjustment signal to adjust the magnitude of the writing current output by the first writing circuit.

7. The system as claimed in claim 6, wherein the first auxiliary writing circuit comprises a current mirror circuit generating an auxiliary current based on a reference current and outputting the auxiliary current to the first writing circuit based on the current adjustment signal.

8. The system as claimed in claim 2, wherein the second writing circuit further comprises a second auxiliary writing circuit receiving the current adjustment signal to adjust the magnitude of the writing current output by the second writing circuit.

9. The system as claimed in claim 8, wherein the second auxiliary writing circuit comprises a current mirror circuit generating an auxiliary current based on a reference current and outputting the auxiliary current to the second writing circuit based on the current adjustment signal.

10. The system as claimed in claim 1, wherein the writing procedure and the verifying procedure are executed in the same cycle.

11. A writing method for a phase change memory, implemented by a first writing circuit and a verifying circuit, wherein the method comprises:
　　performing a writing procedure to a first phase change memory (PCM) cell in a first cycle;
　　performing a verifying procedure to a second PCM cell in the first cycle; and
　　if the verifying result of the second PCM cell is matched, the verifying circuit outputs a current adjustment signal to the first writing circuit to adjust a first writing current output by the first writing circuit.

12. The method as claimed in claim 11, wherein if the writing procedure is not finished and the first writing circuit receives the current adjustment signal, the first writing circuit adjusts the first writing current based on the current adjustment signal and re-executes the writing procedure to the first PCM cell.

13. The method as claimed in claim 11, wherein the verifying circuit further comprises a second writing circuit and when the verifying result of the second PCM cell is wrong, the second writing circuit receives the current adjustment signal to adjust a second writing current output by the second writing circuit and re-executes the writing procedure to the second PCM cell.

14. The method as claimed in claim 11, further comprising:
　　performing the writing procedure to a third PCM cell in a second cycle; and
　　performing the verifying procedure to the first PCM cell in the second cycle.

15. The method as claimed in claim 11, wherein the verifying procedure further comprises:
　　reading the data stored in the second PCM cell;
　　comparing the data stored in the second PCM cell with a reference data; and
　　if the data stored in the second PCM cell and the reference data are not matched, a current adjustment control signal is input to the first writing circuit.

16. The method as claimed in claim 15, wherein the verifying procedure further comprises:
　　if the data stored in the second PCM cell and the reference data are matched, a verify signal is transmitted to the first writing circuit to maintain the magnitude of the first writing current.

* * * * *